(12) United States Patent
Chen et al.

(10) Patent No.: US 9,640,663 B2
(45) Date of Patent: May 2, 2017

(54) HIGH-VOLTAGE FINFET DEVICE HAVING LDMOS STRUCTURE AND METHOD FOR MANUFACTURING THE SAME

(71) Applicant: UNITED MICROELECTRONICS CORPORATION, Hsinchu (TW)

(72) Inventors: Tai-Ju Chen, Tainan (TW); Yi-Han Ye, Tainan (TW); Te-Chih Chen, Kaohsiung (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 77 days.

(21) Appl. No.: 14/583,771

(22) Filed: Dec. 29, 2014

(65) Prior Publication Data

US 2016/0141420 A1    May 19, 2016

(30) Foreign Application Priority Data

Nov. 17, 2014   (TW) .............................. 103139824 A (51) Int. Cl.
| | |
|---|---|
| *H01L 29/78* | (2006.01) |
| *H01L 29/66* | (2006.01) |
| *H01L 21/762* | (2006.01) |
| *H01L 29/40* | (2006.01) |
| *H01L 29/08* | (2006.01) |
| *H01L 29/06* | (2006.01) |
| *H01L 29/165* | (2006.01) |

(52) U.S. Cl.
CPC .... *H01L 29/7851* (2013.01); *H01L 21/76224* (2013.01); *H01L 29/0878* (2013.01); *H01L 29/407* (2013.01); *H01L 29/6681* (2013.01); *H01L 29/66545* (2013.01); *H01L 29/66659* (2013.01); *H01L 29/66681* (2013.01); *H01L 29/7816* (2013.01); *H01L 29/7835* (2013.01); *H01L 29/0653* (2013.01); *H01L 29/165* (2013.01)

(58) Field of Classification Search
CPC .................................................... H01L 29/7851
See application file for complete search history.

(56) References Cited

U.S. PATENT DOCUMENTS

| 7,719,064 B2 | 5/2010 | Wu | |
|---|---|---|---|
| 8,319,289 B2 * | 11/2012 | Shiraishi | H01L 27/0922 257/374 |

(Continued)

*Primary Examiner* — Cuong Q Nguyen
*Assistant Examiner* — Nishath Yasmeen
(74) *Attorney, Agent, or Firm* — Ding Yu Tan (57) ABSTRACT

A high-voltage FinFET device having LDMOS structure and a method for manufacturing the same are provided. The high-voltage FinFET device includes: at least one fin structure, a working gate, a shallow trench isolation structure, and a first dummy gate. The fin structure includes a first-type well region and a second-type well region adjacent to the first-type well region, and further includes a first part and a second part. A trench is disposed between the first part and the second part and disposed in the first-type well region. A drain doped layer is disposed on the first part which is disposed in the first-type well region, and a source doped layer is disposed on the second part which is disposed in the second-type well region. The working gate is disposed on the fin structure which is disposed in the first-type well region and in the second-type well region.

10 Claims, 11 Drawing Sheets

(56) References Cited

U.S. PATENT DOCUMENTS

2011/0309442 A1* 12/2011 Grote .................. H01L 29/0634
                                                                257/339
2012/0193707 A1*  8/2012 Huang ................ H01L 29/7816
                                                                257/335
2013/0187237 A1     7/2013 Yu
2013/0256809 A1* 10/2013 Liu .................... H01L 21/28123
                                                                257/401
2013/0334600 A1* 12/2013 Hsu ................... H01L 29/66681
                                                                257/337

* cited by examiner

HIGH-VOLTAGE FINFET DEVICE HAVING LDMOS STRUCTURE AND METHOD FOR MANUFACTURING THE SAME

BACKGROUND OF THE INVENTION

1. Field of the Invention

The present invention is relating to a high-voltage FinFET (Fin Field-Effect Transistor) device and method for manufacturing the same. More particularly, it is relating to a high-voltage FinFET device having LDMOS structure and method for manufacturing the same.

2. The Related Art

With respect to the conventional MOSFET (Metal-Oxide-Semiconductor Field-Effect Transistor) device of LDMOS (Laterally diffused metal oxide semiconductor) structure, for the purpose of raising the bearable voltage of the drain of the MOSFET, the prior art provides two solutions.

Solution 1: with respect to a N-type MOSFET device, for the same device, the distance between the drain positioned in N-type well region and the source positioned in P-type well region is widened, so as to promote the ability of bearable voltage of the drain. In other words, it promotes the breakdown strength of the device.

Solution 2: with respect to the N-type MOSFET device, the source positioned on the P-type well region and the drain positioned on the N-type well region are disposed in two devices with different active regions respectively. The two devices with different active regions are partitioned by a trench structure, which can also enhance the length between the drain and the source, so as to promote the ability of bearable voltage of the drain. However, either Solution 1 or Solution 2 will result in the problem of component density reduction.

In view of this problem, it is necessary to provide a high-voltage FinFET device having LDMOS structure and method for manufacturing the same, for promoting the ability of the bearable voltage of the drain, and solving the problem of the component density reduction.

SUMMARY OF THE INVENTION

The object of the present invention is to provide a high-voltage FinFET device having LDMOS structure and method for manufacturing the same, for promoting the ability of raising the bearable voltage of the drain, and resolving the problem of the device compact lowering.

For solving the above conventional problem, the present invention provides a high-voltage FinFET device having LDMOS structure includes: (at least one) a FIN structure, the FIN structure has a first-type well region, a second-type well region adjacent to the first-type well region, a first part and a second part, a trench formed in the fin structure and located in the first-type well region disposed between the first part and the second part of the FIN structure, a drain doped layer formed in the first part, a source doped layer formed in the second part, a working gate located across the first-type well region and the second-type well region and on the fin structure, a shallow trench isolation structure located at the trench, and a first dummy gate located in the trench and on the shallow trench isolation structure.

The present invention further provides a method for manufacturing a high-voltage FinFET device having LDMOS structure, including the steps of: providing a substrate having at least one Fin structure, the Fin structure has a first type well region and a second type well region adjacent to the first type well region; forming a trench on the Fin structure, the trench separates the Fin structure to a first part and a second part, the trench positioned at the first well region; forming a shallow trench isolation structure in the trench; forming a first polycrystalline silicon gate stack structure and a second polycrystalline silicon gate stack structure at the Fin structure with exposing a part of the Fin structure; forming a plurality of discontinuous openings on the exposed Fin structure, and growing a epitaxial material layer on the openings; doping the epitaxial material layer filled with the openings, to form a drain doped layer on the first part above the first type well region, and forms a source doped layer on the second part above the second type well region; and performing a replacement metal gate process, to replace the first polycrystalline silicon gate stack structure and the second polycrystalline silicon gate stack structure with a first metal gate stack structure and a second metal stack structure respectively, the first metal gate stack structure is disposed on the first type well region and positioned between the drain doped layer and the second metal gate stack structure, the second metal gate stack structure is disposed on the first well region and positioned between the source doped layer and the first metal gate stack structure.

Accordingly, the present invention provides a high-voltage FinFET device having LDMOS structure and method for manufacturing the same. By defining a shallow trench isolation structure beneath the first dummy gate, which is located between the drain doped layer and the working gate and adjacent to the drain doped layer, it can not only widen the distance between the drain doped layer and the source doped layer, but also promote the ability of raising the bearable voltage of the drain. Furthermore, because the first dummy gate, the working gate, the drain doped layer, and the source doped layer are in the same high-voltage FinFET device, the present invention can avoid the problem of reduction of component density.

The present invention will be apparent to those skilled in the art by reading the following description thereof, with reference to the attached drawings.

DETAILED DESCRIPTION OF THE EMBODIMENT

The present invention will be apparent to those skilled in the art by reading the following description thereof, with reference to the attached drawings.

FIGS. 1A to 1J are a plurality of diagrams of a method for manufacturing a high-voltage FinFET device having LDMOS structure according to an embodiment of the present invention. The detailed steps of the method for manufacturing the high-voltage FinFET device having LDMOS structure will be described as follows.

Figure 1A:
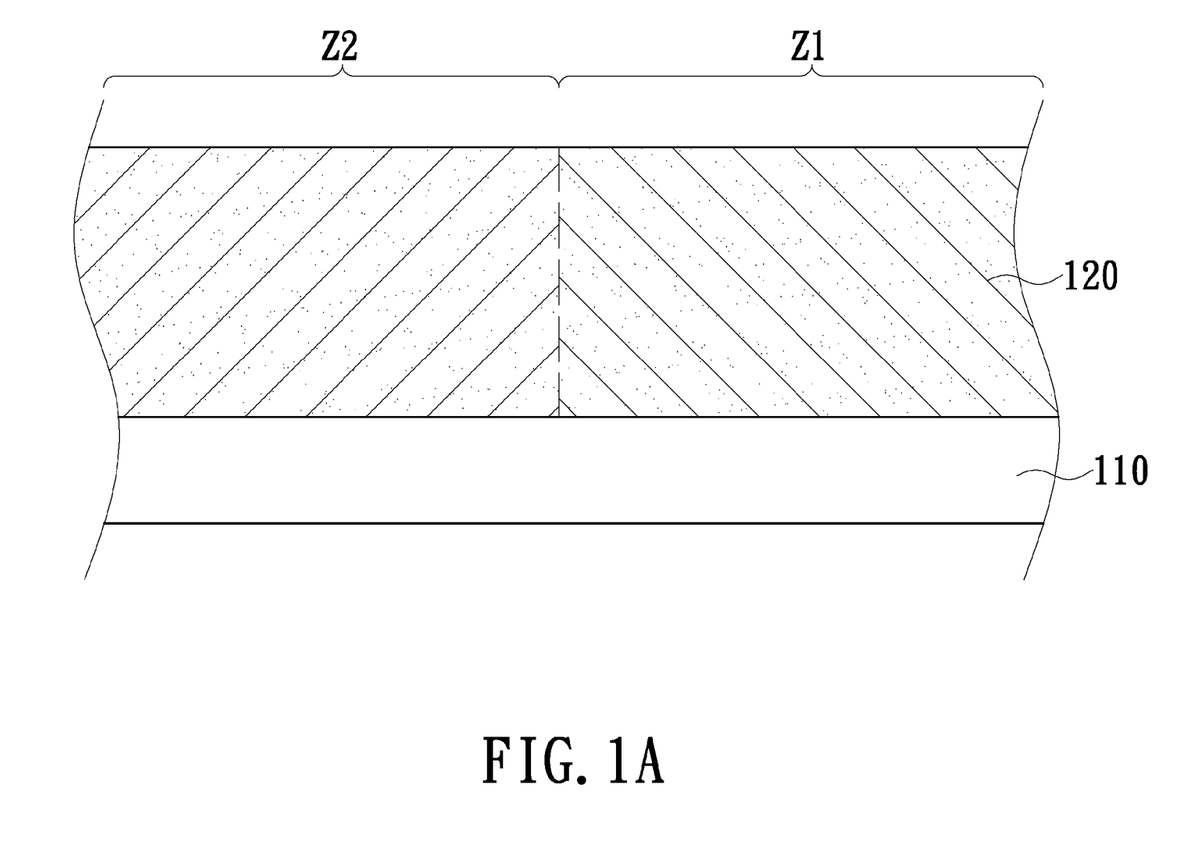
FIGS. 1A to 1J are a plurality of diagrams of a method for manufacturing a high-voltage FinFET device having LDMOS structure according to an embodiment of the present invention.

Referring to FIG. 1A, firstly, a substrate 110 is provided with (at least one) a Fin structure 120 thereon. The Fin structure 120 has a first type well region Z1 and a second type well region Z2 adjacent to the first type well region Z1. The substrate 110 can be, for example, a semiconductor substrate.

Figure 1B:
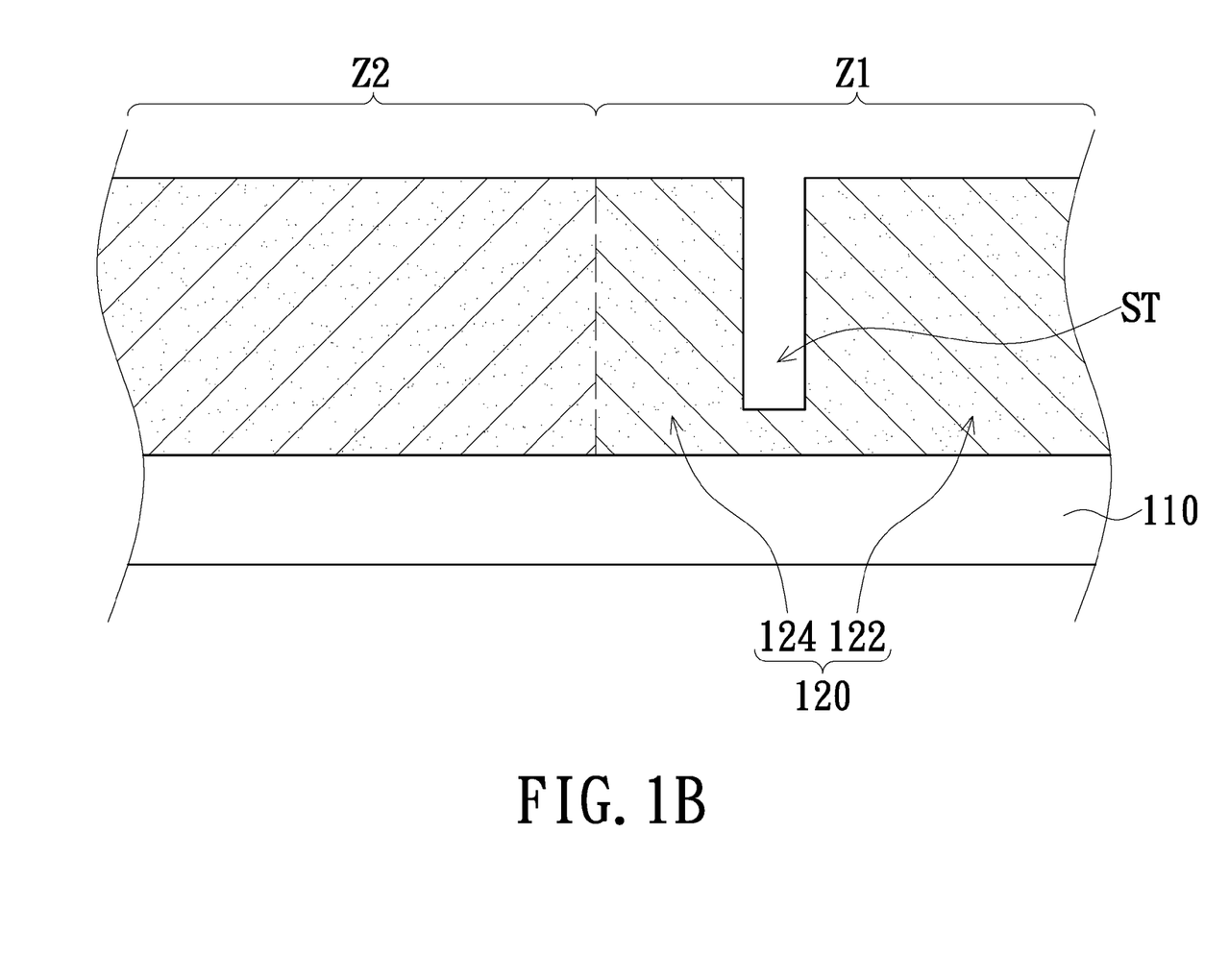
Figure 1C:
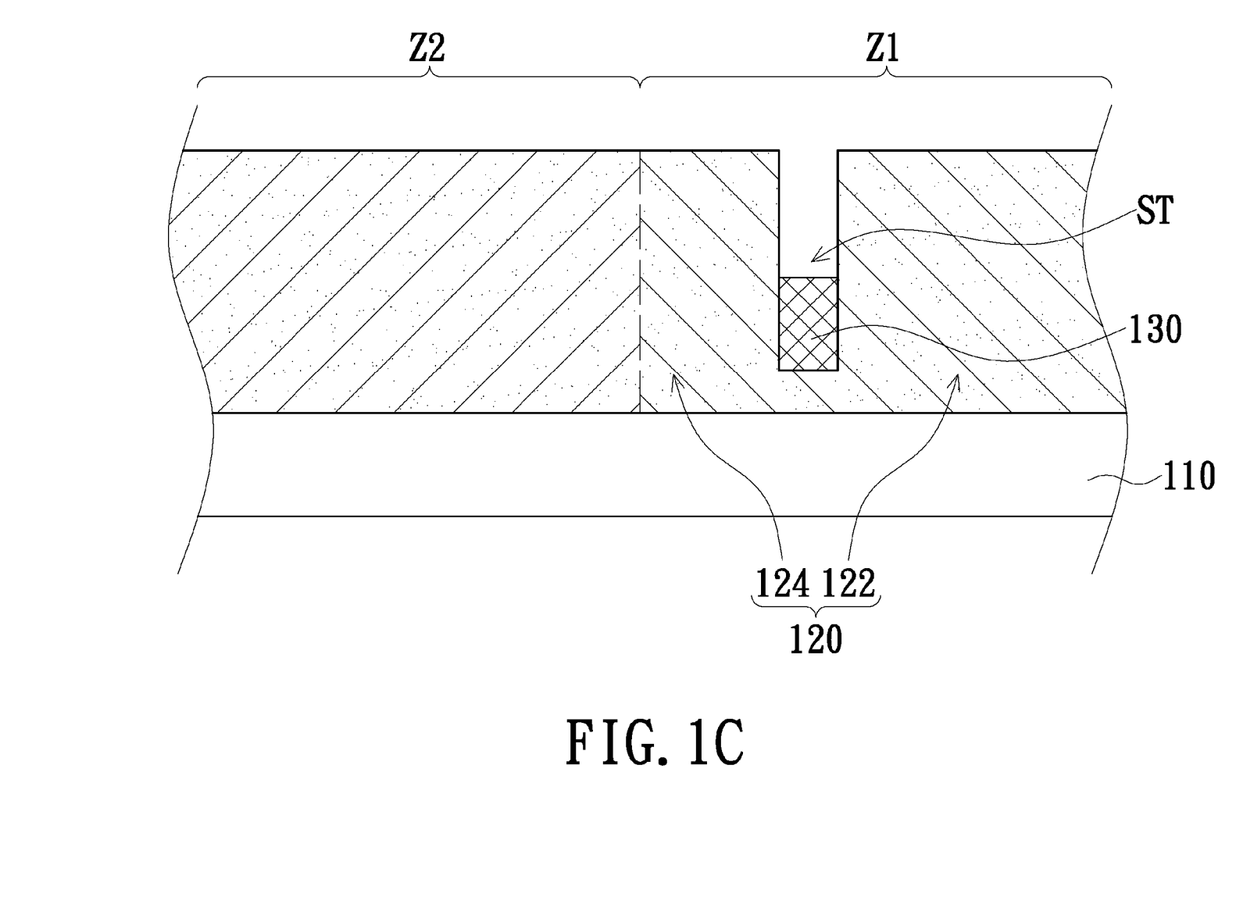

Referring to FIGS. 1B and 1C, then, a trench ST is formed on the Fin structure 120 by means of photo-mask process and etching process. The trench ST separates the Fin structure 120 into a first part 122 and a second part 124, in which the trench ST is located in the first type well region Z1 of the fin structure 120 (FIG. 1B). Therefore, the first part 122 can be completely located within the first type well region Z1, the second part 124 is located partially in the first well region Z1 and entirely within the second well region Z2. Then, a shallow trench isolation structure 130 is formed in the trench ST, wherein the shallow trench isolation structure 130 only fills up a (partial) (bottom) portion of the space of the trench ST (FIG. 1C).

Figure 1D:
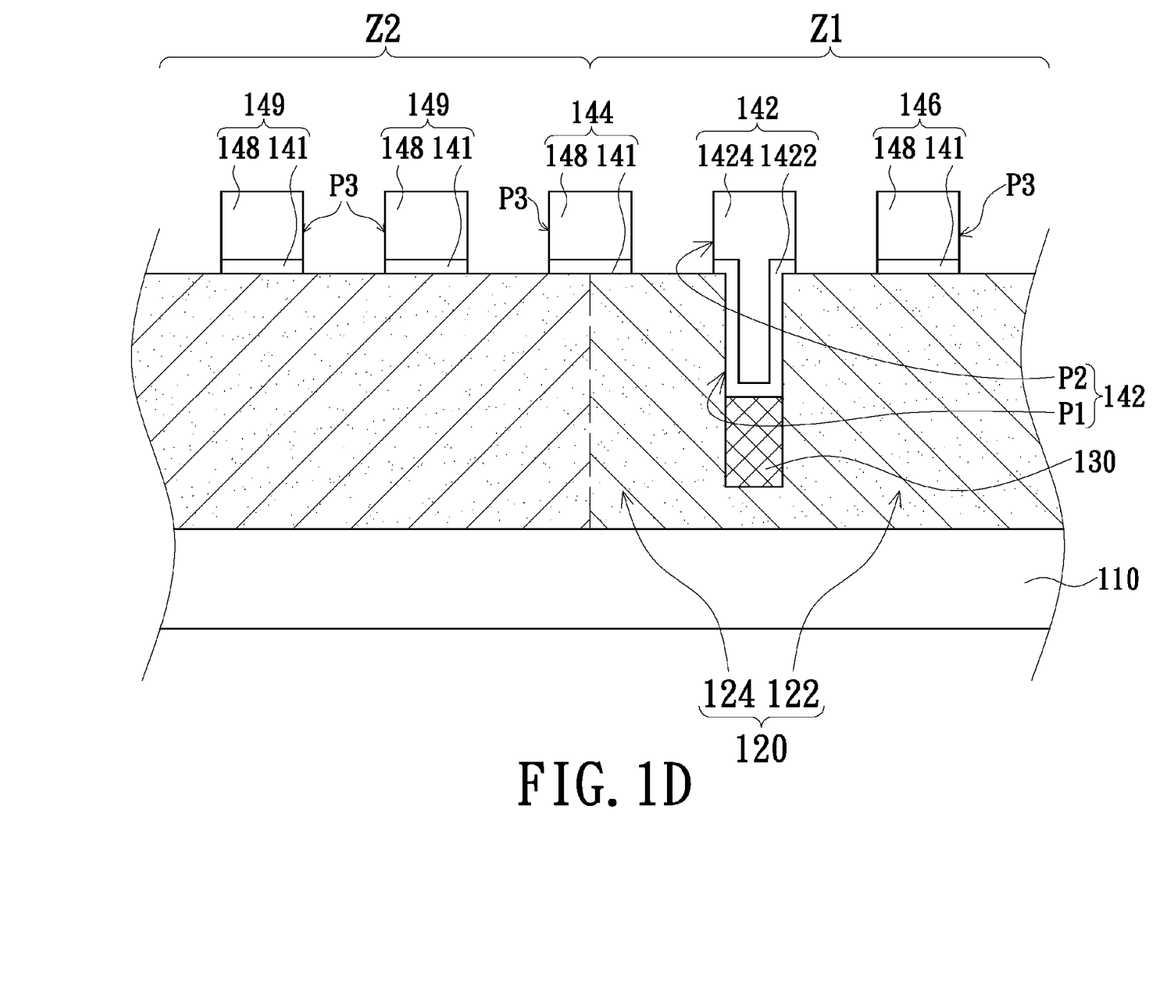

Referring to FIG. 1D, after the process of forming a shallow trench isolation structure 130 in the trench ST, then a first polycrystalline silicon gate stack structure 142, a second polycrystalline silicon gate stack structure 144 and a plurality of third polycrystalline silicon gate stack structures 146 and 149 are formed on the Fin structure 120. The first polycrystalline silicon gate stack structure 142 is located in the first type well region Z1. The second polycrystalline silicon gate stack structure 144 is located in and across both the first type well region Z1 and the second type well region Z2. The third polycrystalline silicon gate stack structure 146 is located in the first type well region Z1, and the third polycrystalline silicon gate stack structures 149 are located in the second type well region Z2. The third polycrystalline silicon gate stack structure 146 is located on a side of the first polycrystalline silicon gate stack structure 142 away from the second polycrystalline silicon gate stack structure 144; and the third polycrystalline silicon gate stack structures 149 are located on a side of the second polycrystalline silicon gate stack structure 144 away from the first polycrystalline silicon gate stack structure 142. Moreover, there is no third polycrystalline silicon gate stack structure formed in between the first polycrystalline silicon gate stack structure 142 and the second polycrystalline silicon gate stack structure 144 as shown in FIG. 1D; however, in other embodiments of the present invention, at least one third polycrystalline silicon gate stack structure can be formed therein-between.

Referring to FIG. 1D, the method of forming the first polycrystalline silicon gate stack structure 142 includes the step of: firstly, forming a gate oxide layer 1422 conformally in the trench ST and on the shallow trench isolation structure 130; and then forming a polycrystalline silicon gate layer 1424 on the gate oxide layer 1422. The polycrystalline silicon gate layer 1424 is not only filling up the trench ST, but also disposed above the Fin structure 120. Moreover, because the first polycrystalline silicon gate stack structure 142 is formed in the trench ST and disposed on the shallow trench isolation structure 130, the first polycrystalline silicon gate stack structure 142 has a vertical extension portion P1 and a horizontal extension portion P2. The vertical extension portion P1 fills up the trench ST and is positioned on the shallow trench isolation structure 130. The horizontal extension portion P2 is positioned on the Fin structure 120, and an extending direction of the horizontal extension portion P2 is perpendicular to an extending direction of the Fin structure 120, as similar to that of a conventional FinFET having a gate electrode formed across on a fin, and the two (namely, the gate electrode and the fin) having two extending directions perpendicular to each other.

Moreover, the second polycrystalline silicon gate stack structure 144 and the third polycrystalline silicon gate stack structures 146 and 149 respectively include a gate oxide layer 141 and a polycrystalline silicon gate layer 148, in which the gate oxide layer 141 is formed on the Fin structure 120 and the polycrystalline silicon gate layer 148 is formed on the gate oxide layer 141. Furthermore, each of the second polycrystalline silicon gate stack structure 144 and the plurality of the third polycrystalline silicon gate stack structures 146 and 149 only have a horizontal extension portion P3 respectively, wherein an extending direction of the horizontal extension portion P3 is also perpendicular to the extending direction of the Fin structure 120.

Figure 1E:
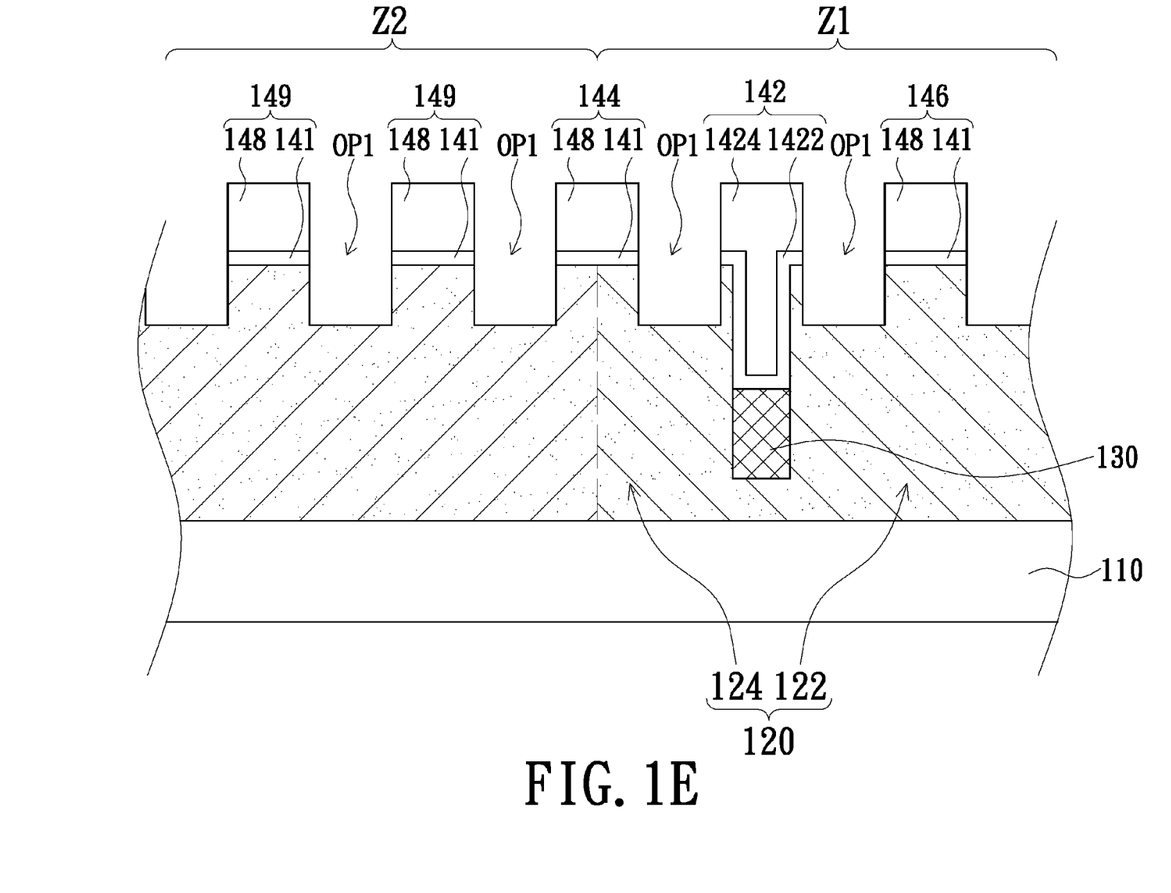
Figure 1F:
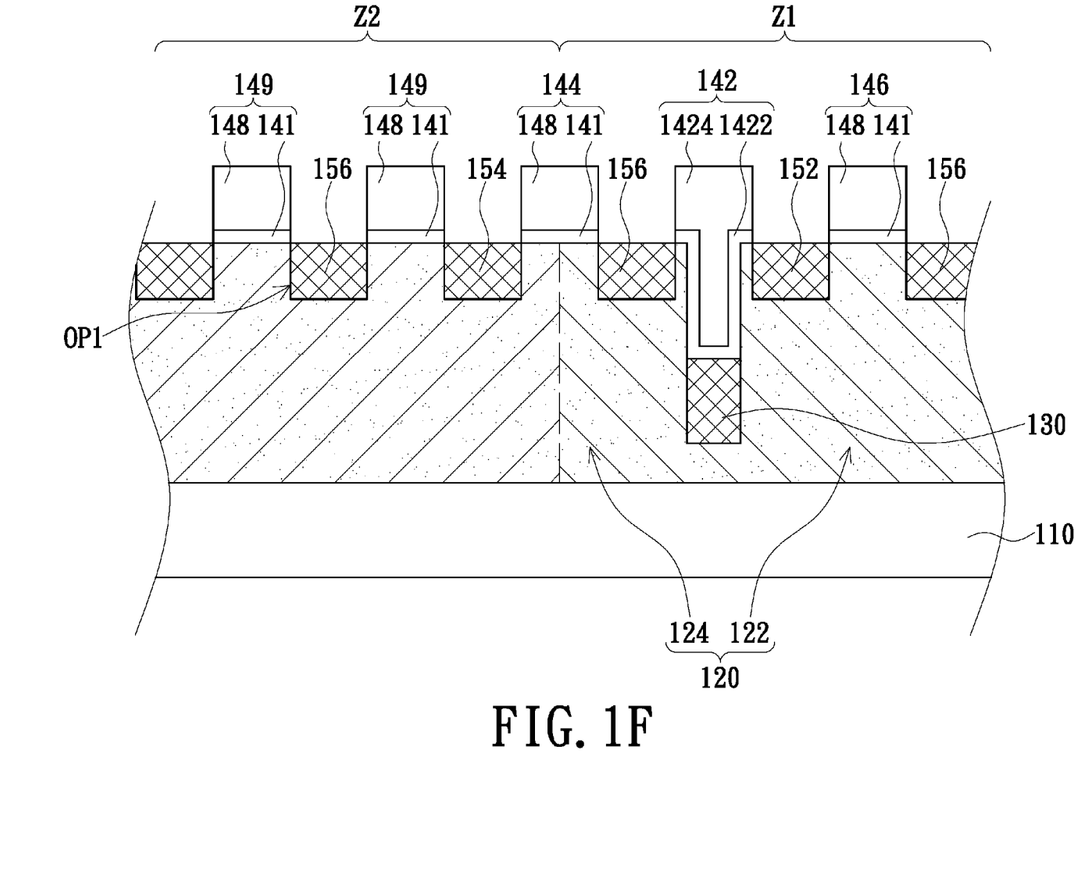

Referring to FIG. 1E and FIG. 1F, after forming the first polycrystalline silicon gate stack structure 142, the second polycrystalline silicon gate stack structure 144 and the third polycrystalline silicon gate stack structures 146 and 149, a plurality of (discontinuous) openings OP1 (FIG. 1E) are formed on the Fin structure 120 by removing a portion of the Fin structure 120 not covered by the first polycrystalline silicon gate stack structure 142, the second polycrystalline silicon gate stack structure 144 and the third polycrystalline silicon gate stack structures 146 and 149. Then, a plurality of (discontinuous) epitaxial material layers 152, 154, 156 are grown in the plurality of openings OP1. Upper surfaces of the epitaxial material layers 152, 154, 156 are flush with the lower surface of the gate oxide layer 141 (FIG. 1F).

Figure 1G:
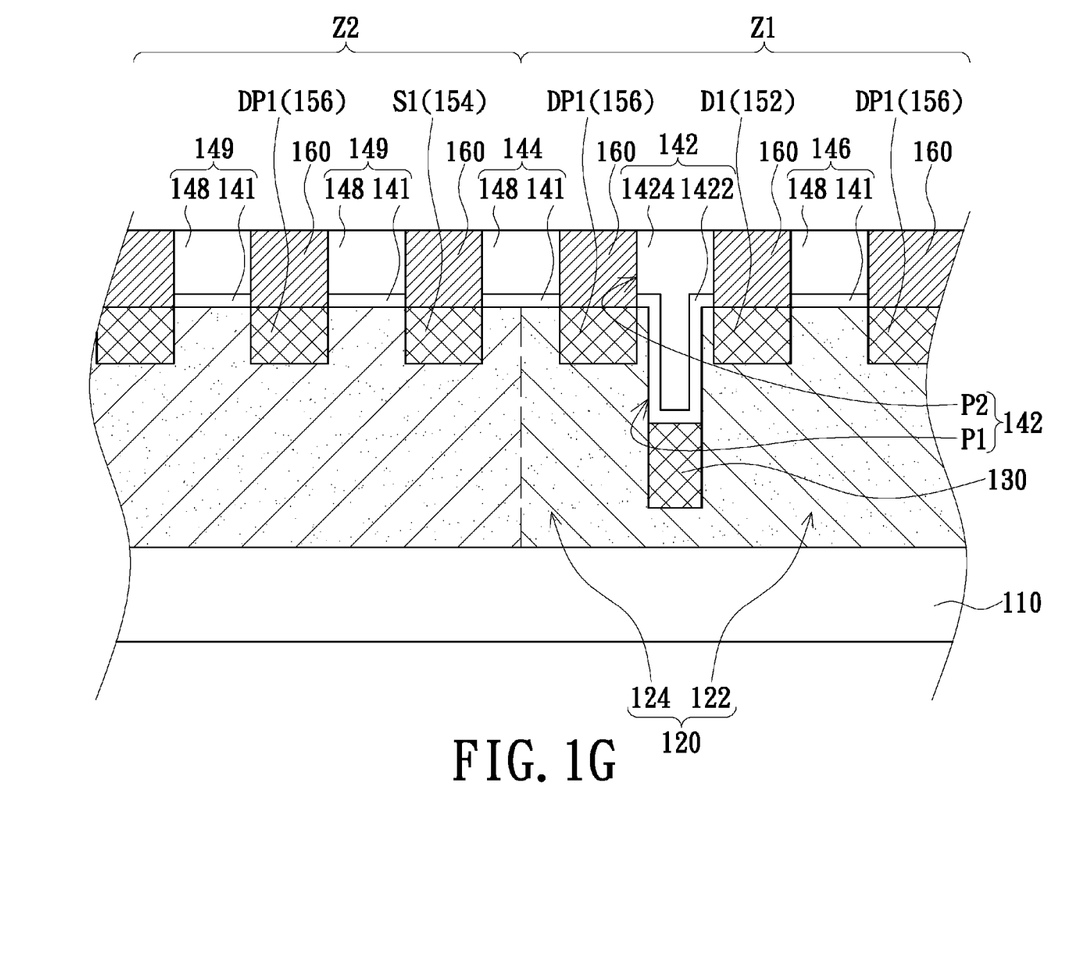

Referring to FIG. 1G, after forming the epitaxial material layer 152, 154, 156, then a doping process is performed toward the epitaxial material layer 152, 154, 156 in the openings OP1 in order to form a drain doped layer D1 from the epitaxial material layer 152 disposed in the first type well region Z1, a source doped layer S1 from the epitaxial material layer 154 disposed in the second type well region Z2, and a first type doped layer DP1 from the plurality of (discontinuous) epitaxial material layers 156. In the description of the embodiment of the present invention hereafter, the first polycrystalline silicon gate stack structure 142 is also referred to as a first dummy gate 142, the second polycrystalline silicon gate stack structure 144 is also referred to as a working gate 144, and the third polycrystalline silicon gate stack structures 146, 149 are also referred to the second dummy gates 146, 149. Then, an isolation layer 160 is formed on the epitaxial material layer 152, 154, 156. The upper surface of the isolation layer 160 is flush with the upper surfaces of the working gate 144, the first dummy gate 142, and the second dummy gates 146 and 149. Wherein the space between the drain doped layer D1 and the source doped layer S1 includes at least one first type doped layer DP1. The first type doped layer DP1 positioned between the drain doped layer D1 and the source doped layer S1 is located in the first type well region Z1. Referring to FIG. 1G, one first type doped layer DP1 is disposed between the drain doped layer D1 and the source doped layer S1, and it is just an example embodiment for illustration. However, in an alternative embodiment, a plurality of the first type doped layers DP1 disposed between the drain doped layer D1 and the source doped layer S1 is also feasible. It is not intended to limit the invention to the precise form disclosed.

Figure 1H:
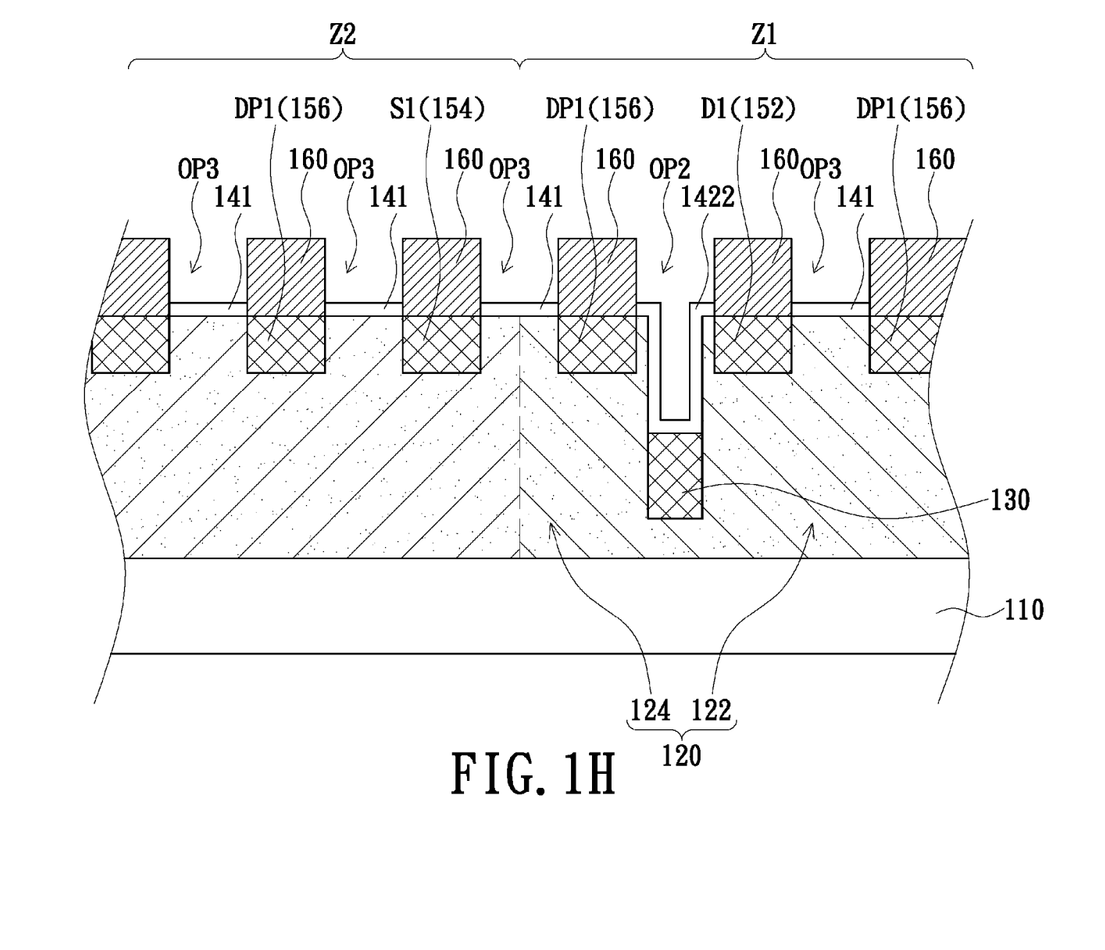
Figure 1I:
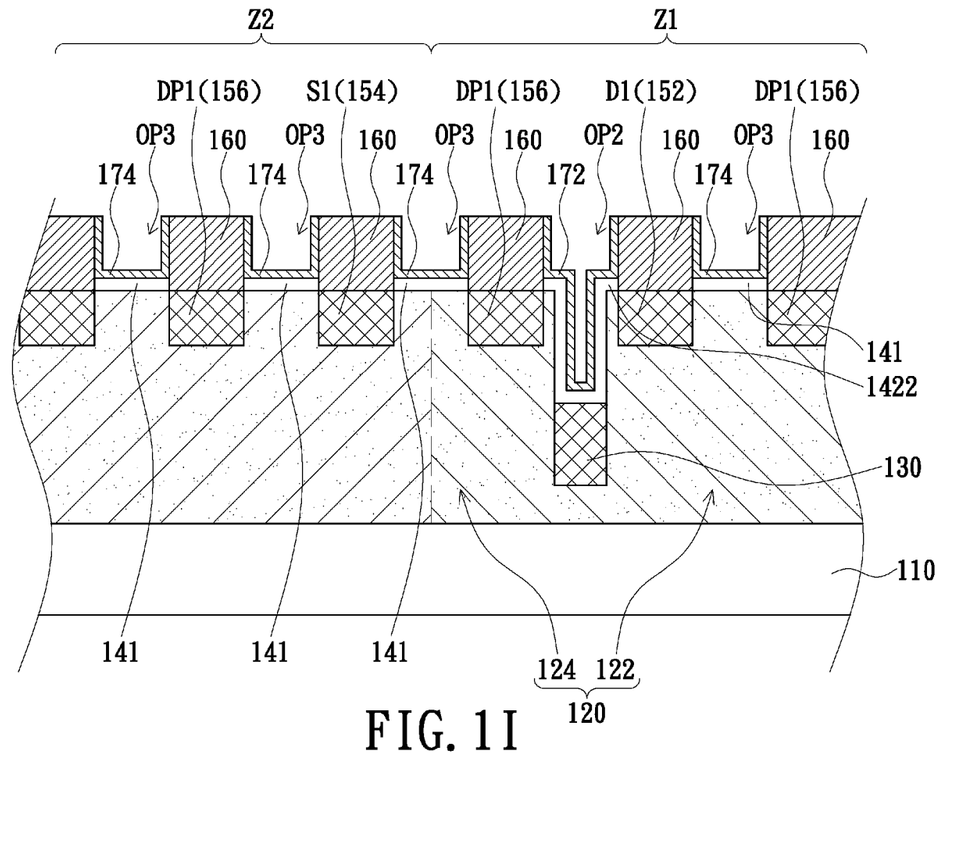
Figure 1J:
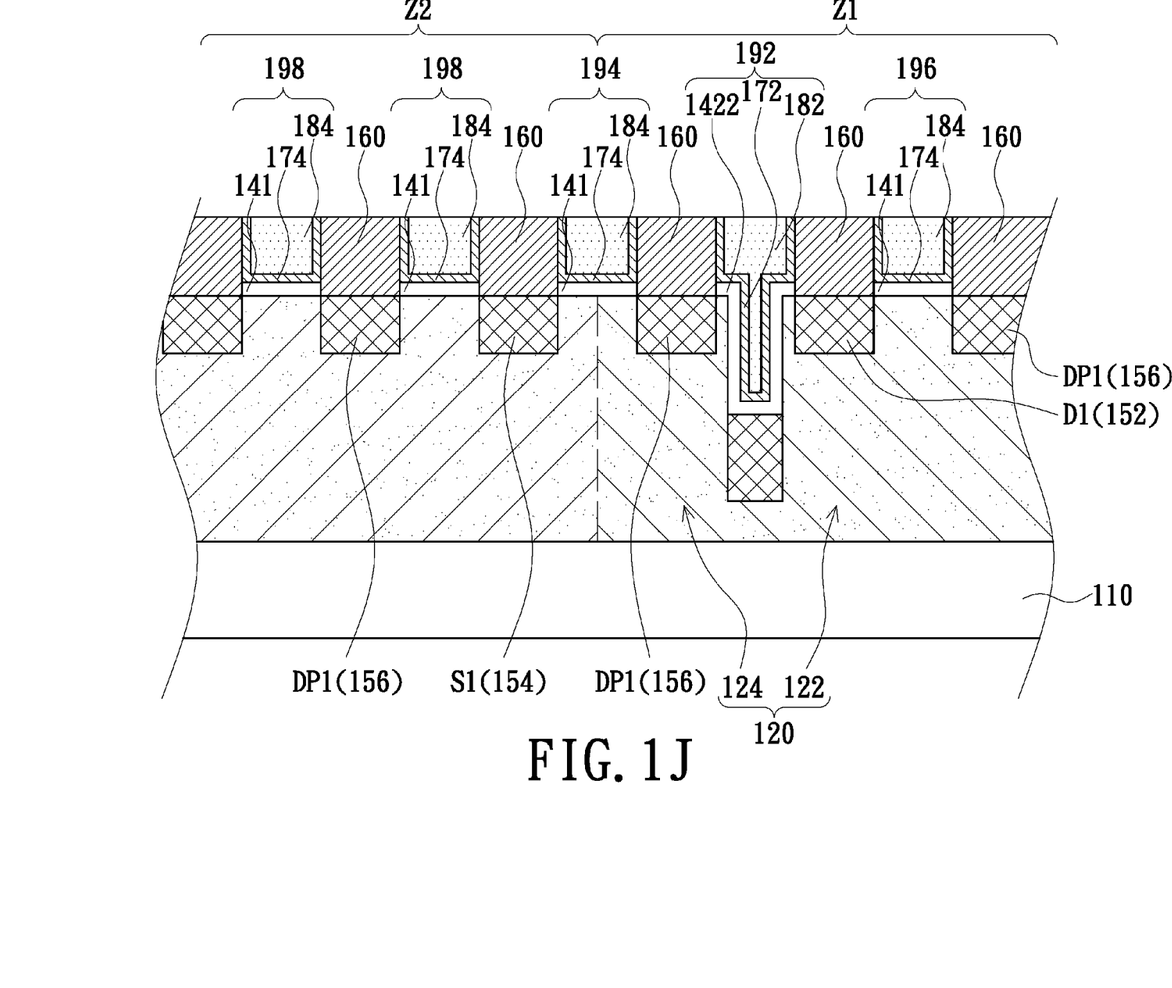

Referring to FIG. 1H to FIG. 1J, after forming the drain doped layer D1, the source doped layer S1 and the plurality of first type doped layer DP1, then performing a RMG (replacement metal gate) process, in order to replace the first polycrystalline silicon gate stack structure 142 with the first metal gate stack structure 192, replace the second polycrystalline silicon gate stack structure 144 with the second metal gate stack structure 194, and replace the third polycrystalline silicon gate stack structures 146, 149 with the third metal gate stack structures 196, 198.

Referring to FIG. 1H to FIG. 1J, the above RMG process include following steps: firstly, removing the polycrystalline silicon gate layer 1424 of the first polycrystalline silicon gate stack structure 142 to form a groove OP2, and removing the polycrystalline silicon gate layer 148 of the second polycrystalline silicon gate stack structure 144 and the third polycrystalline silicon gate stack structures 146, 149 to form a plurality of grooves OP3 (FIG. 1H). Meanwhile, it is optionally to remove the gate oxide layers 1422, 141 positioned under the polycrystalline silicon gate layers 1424, 148, respectively, in the RMG process. The present invention takes FIG. 1H as an example or exemplified embodiment to describe the RMG process without removing the gate oxide layers 1422, 141. However, it is not intended to limit the invention to the precise form disclosed. If the gate oxide layers 1422, 141 are removed in the RMG process, then after removing the gate oxide layers 1422, 141, either a thinner or thicker gate oxide layer is further deposited on the Fin structure 120 where the gate oxide layers 1422, 141 is as shown in FIG. 1F.

After removing the polycrystalline silicon gate layers 1424, 148, then a high-k dielectric material layer 172 is formed conformally on the inner wall of the groove OP2, and a plurality of high-k dielectric material layers 174 are formed conformally on the inner wall of the grooves OP3 respectively (FIG. 1I). Then, a metal gate material layer 182 is formed in the groove OP2 on the high-k dielectric material layer 172, and meanwhile a plurality of metal gate material layers 184 are formed in the grooves OP3 respectively on the high-k dielectric material layers 174 (FIG. 1J). The RMG process is finished when completing the first metal gate stack structure 192, the second metal gate stack structure 194 and the third metal gate stack structures 196, 198. The material of the metal gate material layers 182, 184 can be, for example, Aluminum or Wolfram. The material of the high-k dielectric material layers 172, 174 can be, for example, $HfO_2$ (Hafnium Oxide).

If the first type well region Z1 is a N-type well region, the second type well region Z2 is a P-type well region, and the first type doped layer DP1, the drain doped layer D1 and the source doped layer S1 are N-type doped layers, and the epitaxial material layers 152, 154, 156 are Phosphorus-doped-Silicon epitaxial layers, then the present invention defines the high-voltage FinFET device as a N-type high-voltage FinFET device.

However, If the first type well region Z1 is a P-type well region, the second type well region Z2 is a N-type well region, and the first type doped layer DP1, the drain doped layer D1 and the source doped layer S1 are P-type doped layer, and the epitaxial material layers 152, 154, 156 are Silicon-Germanium epitaxial layers, then the present invention defines the high-voltage FinFET device as a P-type high-voltage FinFET device.

The first metal gate stack structure 192 includes the gate oxide layer 1422, the high-k dielectric material layer 172 and the metal gate material layer 182. The second metal gate stack structure 194 and the third metal gate stack structures 196, 198 individually include the gate oxide layer 141, the high dielectric material layer 174 and the metal gate material layer 184. The first metal gate stack structure 192 is disposed between the drain doped layer D1 and the second metal gate stack structure 194. The second metal gate stack structure 194 is disposed between the source doped layer S1 and the first metal gate stack structure 192.

Moreover, referring to FIG. 1J, the source doped layer S1 is disposed between the third metal gate stack structure 198 and the second metal gate stack structure 194. The drain doped layer D1 is disposed between the first metal gate stack structure 192 and the third metal gate stack structure 196. Furthermore, the second metal gate stack structure 194 and the first metal gate stack structure 192 can be partitioned by zero, one, or a plurality of the third metal gate stack structures 196. Referring to FIG. 1J, in the space between the second metal gate stack structure 194 and the first metal gate stack structure 192, there is no third metal gate stack structure being disposed in this space, the present invention take it as an example for illustration. However, it is not intended to limit the invention to the precise form disclosed.

Noticeably, referring to FIG. 1G-1J, between the second metal gate stack structure 194 and the first metal gate stack structure 192 is spaced out by at least one of the first type doped layer DP1, formed from the epitaxial material layer 156, and the isolation layer 160 disposed thereon (FIG. 1G).

On the operation of the high-voltage FinFET device having LDMOS structure, because the second metal gate stack structure 194 spans on the first type well region Z1 and the second type well region Z2, the second metal gate stack structure 194 is generally functioned as a working gate. The first gate stack structure 192 and the third metal gate stack structure 196 are functioned as a dummy gate structure. For promoting the ability of bearable voltage of the drain doped layer D1, the present invention provides a solution of having at least one first metal gate stack structure 192 and a shallow trench isolation 130 therebeneath, disposed between the drain doped layer D1 and the working gate (the second metal gate stack structure 194), and having the first metal gate structure 192 disposed on and contacting with one side of the drain doped layer D1. Then the present invention can promote the ability of bearable voltage of the drain doped layer D1 by virtue of the shallow trench isolation structure 130 beneath the first metal gate stack structure 192.

Figure 2:
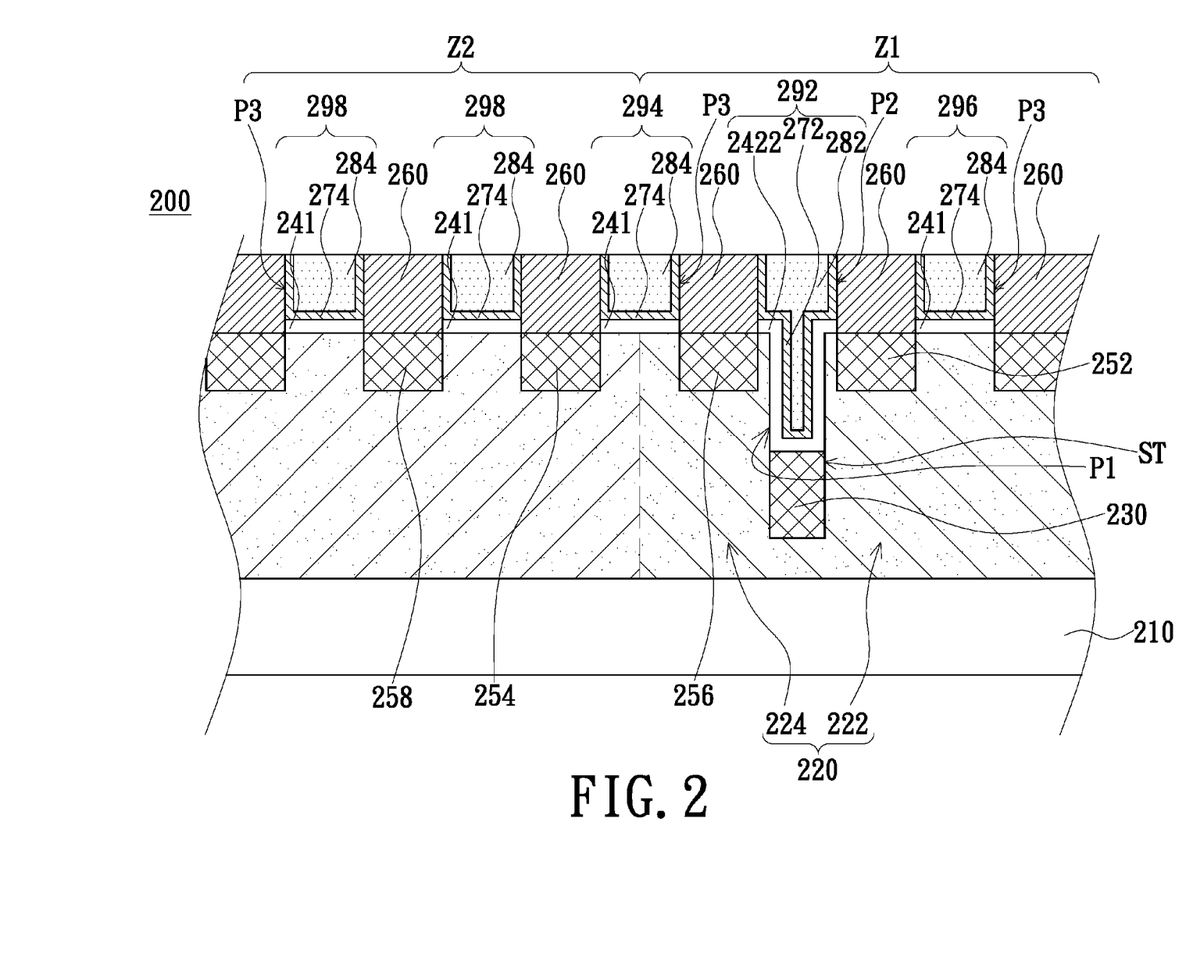
FIG. 2 is a diagram of a high-voltage FinFET device having LDMOS structure according to an embodiment of the present invention.

FIG. 2 is the sectional view of a high-voltage FinFET device having LDMOS structure according to an embodiment of the present invention. The embodiment of present invention provides a high-voltage FinFET device 200 having LDMOS structure which includes at least one Fin structure 220, a shallow trench isolation structure 230, a drain doped layer 252, a source doped layer 254, a plurality of first type doped layers 256, 258, an isolation layer 260, a first dummy gate 292, a working gate 294, a plurality of second dummy gates 296, 298.

Referring to FIG. 2, the Fin structure 220 is disposed on the substrate 210, the Fin structure 220 has a first type well region Z1 and the second type well region Z2 adjacent to the first type well region Z1. Furthermore, the Fin structure 220 further include a first part 222 and a second part 224, wherein the first part 222 and the second part 224 is spaced apart by a trench ST. The trench ST is located in the first type well region Z1 of the fin structure 220. The shallow trench isolation structure 230 is disposed in the trench ST.

Referring to FIG. 2, the drain doped layer 252, the source doped layer 254, the plurality of the first type doped layers 256, 258 are disposed on the Fin structure 220, wherein at least one or a plurality of the first type doped layers 256 is disposed between the drain doped layer 252 and the source doped layer 254. In FIG. 2, one first type doped layer 256 is disposed between the drain doped layer 252 and the source doped layer 254, and it is used as an example to illustrate the present invention. However, it is not intended to limit the invention to the precise form disclosed.

The first type doped layer 256, the drain doped layer 252 and the source doped layer 254 are spaced from each other by the Fin structure 220. In addition, the drain doped layer 252 and at least one first type doped layer 256 are disposed in the first type well region Z1 on the Fin structure 220, the source doped layer 254 and the first type doped layers 258 are disposed in the second type well region Z2 on the Fin structure 220. The drain doped layer 252 is disposed on the first part 222 of the Fin structure 220. The first type doped layers 256, 258, the source doped layer 254 are all disposed on the second part 224 of the Fin structure 220.

Referring to FIG. 2, the working gate 294, the first dummy gate 292 and the second dummy gates 296, 298 are all disposed on the Fin structure 220. Moreover, an isolation layer 260 is disposed between the working gate 294 and the first dummy gate 292, between the first dummy gate 292 and the second dummy gate 296, and between the working gate 294 and the second dummy gate 298, respectively. Moreover, the isolation layer 260 is disposed on the drain doped layer 252, the source doped layer 254 and the first type doped layers 256, 258, individually. The first dummy gate 292 is adjacent to the isolation layer 260 positioned on the drain doped layer 252, the working gate 294 is adjacent to the isolation layer 260 positioned on the source doped layer 254.

The working gate 294 spans in both the first type well region Z1 and the second type well region Z2, and is positioned on the Fin structure 220. The first dummy gate 292 is disposed on the shallow trench isolation structure 230, and disposed in the trench ST the first type well region Z1. The second dummy gate 296 is positioned in the first type well region Z1, The second dummy gate 298 is positioned in the second type well region Z2. The first dummy gate 292 is positioned between the drain doped layer 252 and the working gate 294. The working gate 294 is positioned between the first dummy gate 292 and the source doped layer 254. The source doped layer 254 is positioned between the second dummy gate 298 and the working gate 294. The drain doped layer 252 is positioned between the first dummy gate 292 and the second dummy gate 296.

The first dummy gate 292 has a vertical extension portion P1 and a horizontal extension portion P2, wherein the horizontal extension portion P2 is disposed on both the first part 222 and the second part 224 of the Fin structure 220, the vertical extension portion P1 is disposed in the trench ST and located on the shallow trench isolation structure 230. The working gate 294 and the plurality of second dummy gates 296, 298 only include a horizontal extension portion P3, respectively. In addition, the first dummy gate 292 include a gate oxide layer 2422, a metal gate material layer 282 and a high dielectric material layer 272 surrounding the metal gate material layer 282 and covering conformally on a side of the metal gate material layer 282 adjacent to the Fin structure 220.

The gate oxide layer 2422 is disposed on the Fin structure 220. The working gate 294 and the plurality of second dummy gates 296, 298 individually include a gate oxide layer 241, a metal gate material layer 284 and a high-k dielectric material layer 274 surrounding the metal gate material layer 284, wherein the gate oxide layer 241 is disposed on the Fin structure 220.

In addition, the material of the metal gate material layers 282, 284 can be, for example, Aluminum (Al) or Wolfram (W). The material of the high dielectric material layers 274, 284 can be, for example, Hafnium Oxide ($HfO_2$).

Noticeably, if the high-voltage FinFET device 200 having LDMOS structure of the embodiment of present invention is defined as a N-type high-voltage FinFET, then the first type well region Z1 is a N-type well region, the second type well region Z2 is a P-type well region, the first type doped layer 256, 258, the drain doped layer 252 and the source doped layer 254 are N-type doped layer. The drain doped layer 252, the source doped layer 254 and the first type doped layers 256, 258 are Phosphorus-doped-Silicon epitaxial layer respectively.

Moreover, if the high-voltage FinFET device 200 having LDMOS structure of the embodiment of present invention is defined as a P-type high-voltage FinFET, then the first type well region Z1 is a P-type well region, the second type well region Z2 is a N-type well region, the first type doped layers 256, 258, the drain doped layer 252 and the source doped layer 254 are P-type doped layer. The drain doped layer 252, the source doped layer 254 and the first type doped layers 256, 258 are Silicon-Germanium epitaxial layer respectively.

In addition, referring to FIG. 2, because the high-voltage FinFET device 200 having LDMOS structure of the embodiment of present invention further includes a shallow trench isolation structure 230 disposed beneath the first dummy gate 292, which is between the drain doped layer 252 and the working gate 294, and neighboring/adjacent to the drain doped layer 252, it can not only widen the distance between the drain doped layer 252 and the source doped layer 254, but also promote the bearable voltage of the drain doped layer 252 by virtue of the shallow trench isolation structure 230.

Therefore, between the first dummy gate 292 and the working gate 294, zero, one or a plurality of the second dummy gates 296, 298 can be disposed. If there is a second dummy gate 296 disposed between the first dummy gate 292 and the working gate 294, then the first dummy gate 292, the second dummy gate 296 and the working gate 294 are separated from each other by the isolation layer 260.

If there is no second dummy gate disposed between the first dummy gate 292 and the working gate 294, then the first dummy gate 292 and the working gate 294 are separated by the isolation layer 260. In FIG. 2, there is no second dummy gate being disposed between the first dummy gate 292 and the working gate 294, it is used as an example to illustrate the present invention. However, it is not intended to limit the invention to the precise form disclosed. Noticeably, if there is one or more second dummy gates 296 disposed between the first dummy gate 292 and the working gate 294, then the distance between the drain doped layer 252 and the source doped layer 254 will be wider, so as to correspondingly promote the bearable voltage of the drain doped layer 252.

As described above, the present invention provides a high-voltage FinFET device having LDMOS structure and method for manufacturing the same. By defining a shallow trench isolation structure beneath the first dummy gate, which is located between the drain doped layer and the working gate and adjacent to the drain doped layer, it can not only widen the distance between the drain doped layer and the source doped layer, but also promote the ability of raising the bearable voltage of the drain. Furthermore, because the first dummy gate, the working gate, the drain doped layer and the source doped layer are designed into the same high-voltage FinFET device, the present invention can avoid the problem of lowering device density.

The foregoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. A high-voltage FinFET device having LDMOS structure, comprising:
   a fin structure, having a first-type well region, a second-type well region adjacent to the first-type well region;
   a trench, formed in the first-type well region of the fin structure and separating the fin structure into a first part and a second part;
   a drain doped layer, formed in the first part of the fin structure;
   a source doped layer, formed in the second part of the fin structure and in the second-type well region;
   a working gate, located on the fin structure across the first-type well region and the second-type well region;
   a shallow trench isolation structure, located in the trench, and
   a first dummy gate, located in the trench and on the shallow trench isolation structure.

2. The high-voltage FinFET device as claimed in claim 1, further comprising:
   a plurality of first type doped layers, wherein at least one of the first type doped layers is in the first-type well region and disposed between the drain doped layer and the source doped layer, and the first type doped layers are discontinuous.

3. The high-voltage FinFET device as claimed in claim 2, wherein the first-type well region is a N-type well region, the second-type well region well region is a P-type well region, and the first type doped layer, the drain doped layer and the source doped layer are N-type doped layers.

4. The high-voltage FinFET device as claimed in claim 3, wherein the drain doped layer, the source doped layer and the first type doped layers are Phosphorus-doped-Silicon epitaxial layers.

5. The high-voltage FinFET device as claimed in claim 2, wherein the first-type well region is a P-type well region, the second-type well region is a N-type well region, the first type doped layer, the drain doped layer and the source doped layer are N-type doped layers.

6. The high-voltage FinFET device as claimed in claim 5, wherein the drain doped layer, the source doped layer and the first type doped layers are Silicon-Germanium epitaxial layers.

7. The high-voltage FinFET device as claimed in claim 1, wherein the first dummy gate and the working gate individually include a metal gate material layer and a high-k dielectric material layer surrounding the metal gate material layer.

8. The high-voltage FinFET device as claimed in claim 7, wherein the material of the metal gate material layer is Aluminum or Wolfram, the material of the high dielectric material layer is Hafnium Oxide (HfO2).

9. The high-voltage FinFET device as claimed in claim 1, further comprising:
   a plurality of second dummy gates, disposed on the fin structure, wherein the working gate and the second dummy gate individually include a horizontal extension portion, the second dummy gates include a metal gate material layer and a high-k dielectric material layer surrounding the metal gate material layer, the source doped layer is disposed between the second dummy gate and the working gate, or the drain doped layer is disposed between the first dummy gate and the second dummy gate.

10. The high-voltage FinFET device as claimed in claim 1, wherein the first dummy gate has a vertical extension portion and a horizontal extension portion connected with the vertical extension portion, the horizontal extension portion located at the first part and the second part of the fin structure, the vertical extension portion is located in the trench and positioned on the shallow trench isolation structure, the first dummy gate is located between the drain doped layer and the working gate, and the working gate is located between the first dummy gate and the source doped layer.

* * * * *